United States Patent
Pförtner et al.

(10) Patent No.: US 10,959,332 B2
(45) Date of Patent: Mar. 23, 2021

(54) ASSEMBLY HAVING AN ELECTROTECHNICAL COMPONENT ON A CARRIER

(71) Applicant: PHOENIX CONTACT GMBH & CO KG, Blomberg (DE)

(72) Inventors: Steffen Pförtner, Springe (DE); Martin Wetter, Detmold (DE)

(73) Assignee: PHOENIX CONTACT GMBH & CO KG, Blomberg (DE)

( * ) Notice: Subject to any disclaimer, the term of this patent is extended or adjusted under 35 U.S.C. 154(b) by 0 days.

(21) Appl. No.: 16/690,333

(22) Filed: Nov. 21, 2019

(65) Prior Publication Data
US 2020/0170115 A1    May 28, 2020

(30) Foreign Application Priority Data
Nov. 23, 2018    (DE) .................... DE102018220149.8

(51) Int. Cl.
H05K 1/18    (2006.01)
H05K 1/02    (2006.01)
H05K 1/11    (2006.01)

(52) U.S. Cl.
CPC .......... *H05K 1/181* (2013.01); *H05K 1/0268* (2013.01); *H05K 1/111* (2013.01); *H05K 2201/10166* (2013.01); *H05K 2201/10174* (2013.01); *H05K 2201/10196* (2013.01);
(Continued)

(58) Field of Classification Search
CPC ...... H05K 1/181; H05K 1/0268; H05K 1/111; H05K 2201/10265; H05K 2201/10174; H05K 2201/10166; H05K 2201/10196; H05K 2201/10636; H05K 2201/10537
See application file for complete search history.

(56) References Cited

U.S. PATENT DOCUMENTS

2002/0022402 A1*  2/2002  Dallavalle ............... H01L 23/50
                                                       439/620.01

FOREIGN PATENT DOCUMENTS

DE    102008057166    5/2010
DE    102014105683    12/2014
JP      2007-251134    9/2007

OTHER PUBLICATIONS

Official Action for German Patent Application No. 102018220149.8, dated Aug. 2, 2019, 6 pages.

* cited by examiner

*Primary Examiner* — Steven T Sawyer
(74) *Attorney, Agent, or Firm* — Sheridan Ross P.C.

(57) ABSTRACT

The invention relates to an assembly with an electrotechnical component on a carrier. A first electrical connecting line and a second electrical connecting line going to the electrotechnical component are provided on or in the carrier. The electrotechnical component comprises a first connection and a second connection. The first connection is attached on the carrier by a thermally softenable solder material to the first electrical power supply line, and the second connection is attached on the carrier by a thermally softenable solder material to the second electrical power supply line. A first electrical signal line to the electrotechnical component is provided on or in the carrier. The assembly furthermore comprises a mechanical prestressing, which in the event that the solder material is softened can displace the electrotechnical component on the surface substantially in a parallel plane to the carrier or orthogonally to the carrier.

7 Claims, 4 Drawing Sheets

(52) U.S. Cl.
CPC .............. *H05K 2201/10265* (2013.01); *H05K 2201/10537* (2013.01); *H05K 2201/10636* (2013.01)

ASSEMBLY HAVING AN ELECTROTECHNICAL COMPONENT ON A CARRIER

CROSS-REFERENCE TO RELATED APPLICATION

This application claims the benefit of German Patent Application No. DE 10 2018 220 149.8 filed on Nov. 23, 2018, the entire contents of which are incorporated herein by reference in its entirety.

The invention relates to an assembly having an electrotechnical component on a carrier.

BACKGROUND OF THE INVENTION

The overloading of electrotechnical components may result in them working outside the rated operating range. The power conversion caused by a reduced component insulating strength at a damaged electrotechnical component, for example, may result in unacceptable heating.

If the unacceptable heating of the electrotechnical component is not prevented, it may result for example in the damaging of the electrotechnical component itself, as well as surrounding materials, or even to an ignition and/or the release of toxic gases and/or explosive destruction.

In order to curb these effects, temperature fuses are often associated with the electrotechnical component in order to enable a disconnection in the event of unacceptable heating. The temperature fuse is thermally attached to the electrotechnical component being monitored.

The problem with this, however, is that only a very limited thermal coupling is available, so that such layouts are not suitable for rapid heating processes, because the thermal conduction requires too much time.

Due to the limited thermal coupling possibility, this layout is not suitable for rapid heating processes.

Therefore, the voltage surge protection component used for example in voltage surge protection devices, especially varistors, gas discharge tubes (GDT) and transient voltage suppressor (TVS) diodes, is outfitted with activatable disconnection devices.

For example, such thermal disconnection devices are described for damaged voltage surge protection components in patents DE 42 41 311 of the applicant, DE 699 04 274, and U.S. Pat. No. 6,430,019.

The solutions described in the patents all work by the same basic principle. The component being monitored is attached in a thermosensitive manner via a contact element. The thermosensitive attachment occurs generally via a soldered connection. The contact element is mounted in a prestressed state, or the force of a second prestressed element, such as a spring, acts on the contact element. If the spring force exceeds the holding force of the thermosensitive contact site, such as a soldered site, the contact opens and the monitored component is disconnected.

Equally important to the disconnection of a component in the case of overload or fault is the displaying of the device defect, in order to alert the user to the lack of protection and/or to the need for a replacement.

Since such components are generally located in switch/fuse cabinets, a defect can only be recognized on the device.

Therefore, telecommunications devices are being used increasingly so that a malfunction can also be recognized at another location.

These telecommunications devices are based on the use of a direct or indirect switching device.

However, it turns out that such mechanical switching devices are prone to malfunction, in addition to having a large space requirement.

It would therefore be desirable to provide an assembly in which a disconnection can be detected and remotely communicated with simple means.

The solution of the problem according to the invention is provided by the features of the independent claim. Advantageous embodiments of the invention are indicated in the dependent claims, the specification, and the figures.

BRIEF DESCRIPTION OF THE DRAWINGS

The invention shall be explained more closely in the following, making reference to the enclosed drawing, with the aid of preferred embodiments.

Figure 1:
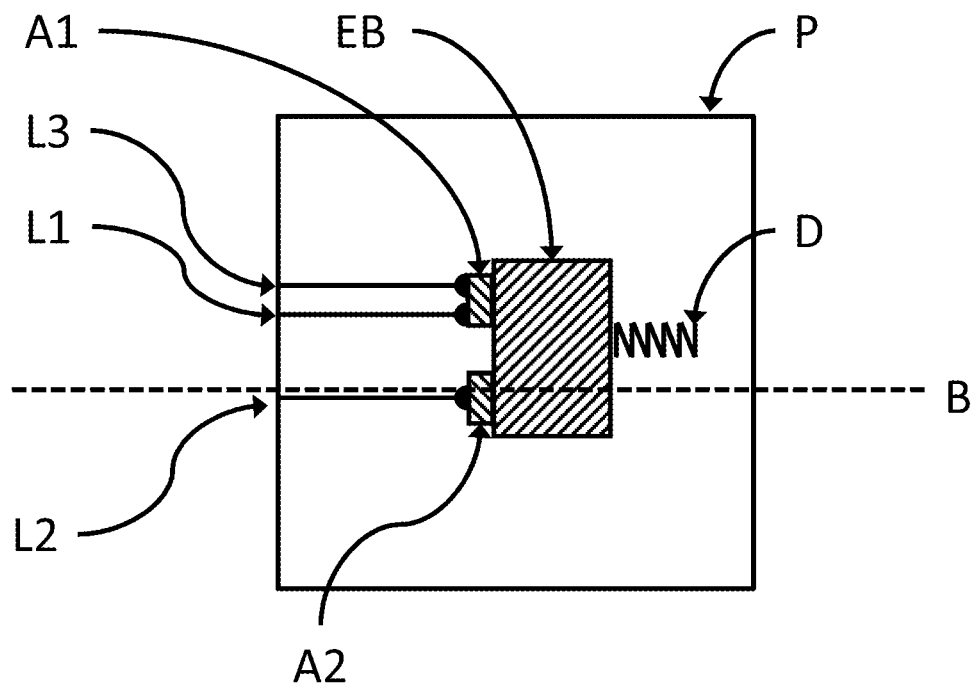
FIG. 1 shows a schematic layout of an assembly according to embodiments of the invention in a plan view in a first state.
Figure 2:
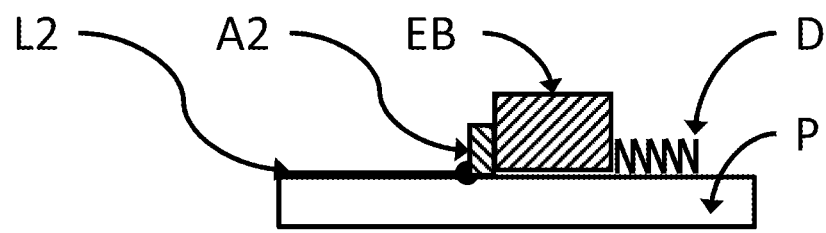
FIG. 2 shows a schematic layout of an assembly according to embodiments of the invention per FIG. 1 in a side view in a first state.

The invention shall be represented in the following with reference to the figures. It should be noted that different aspects shall be described, each of which may be used alone or in combination. That is, any aspect may be used with different embodiments of the invention, unless explicitly presented as a pure alternative.

Furthermore, for the sake of simplicity, generally only one entity shall be referred to in the following. But, unless specifically stated, the invention may also have several of the mentioned entities. Accordingly, the use of the word "a" or "an" should only be taken to mean that at least one entity is used in a simple embodiment.

So far as methods are described in the following, the individual steps of a method may be arranged and/or combined in any given sequence, as long as the context does not indicate otherwise. Furthermore, the methods may be combined with each other, as long as not explicitly indicated otherwise.

Indications with numerical values should generally not be taken as exact values, but rather also contain a tolerance of +/−1% to +/−10%.

Insofar as standards, specifications, or the like are mentioned in this application, they always refer at least to the standards, specifications, or the like which are applied on the date of the application. That is, if a standard/specification etc. is updated or replaced by a later version, the invention is also applicable to it.

The figures represent various embodiments.

An assembly according to the invention—as represented in FIGS. 1 to 4—comprises a carrier P. An electrotechnical component EB is arranged on the carrier P. A first electrical power supply line L1 and a second electrical power supply line L2 going to the electrotechnical component EB are provided on or in the carrier P.

The electrotechnical component EB comprises a first connection A1 and a second connection A2, wherein the first connection A1 is attached on the carrier P by a thermally softenable solder material to the first electrical power supply line L1. The second connection A2 is attached on the carrier P by a thermally softenable solder material to the second electrical power supply line L2.

A first electrical signal line L3 to the electrotechnical component EB is provided on or in the carrier P, wherein the first connection A1 on the carrier P is attached by a thermally softenable solder material to the first electrical signal line L3 as well.

The assembly furthermore comprises a mechanical prestressing D, which in the event that the solder material is softened can displace the electrotechnical component EB on the surface substantially in a parallel plane to the carrier P or orthogonally to the carrier P so that the electrical attachment of the first electrical power supply line L1, the second electrical power supply line L2 and the first electrical signal line L3 is interrupted such that a potential can now be measured between the first electrical power supply line L1 and the first electrical signal line L3.

Figure 3:
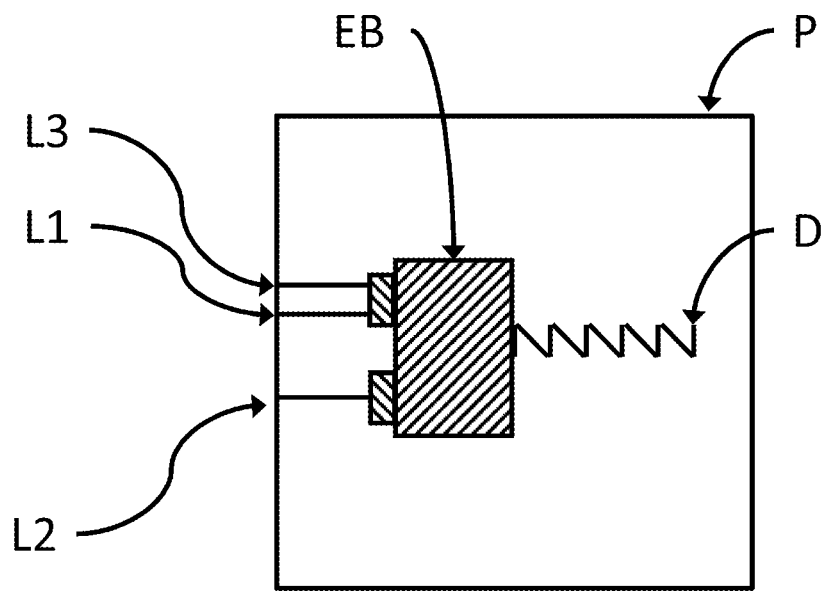
FIG. 3 shows a schematic layout of an assembly according to embodiments of the invention per FIG. 1 in a plan view in a second state.
Figure 5:
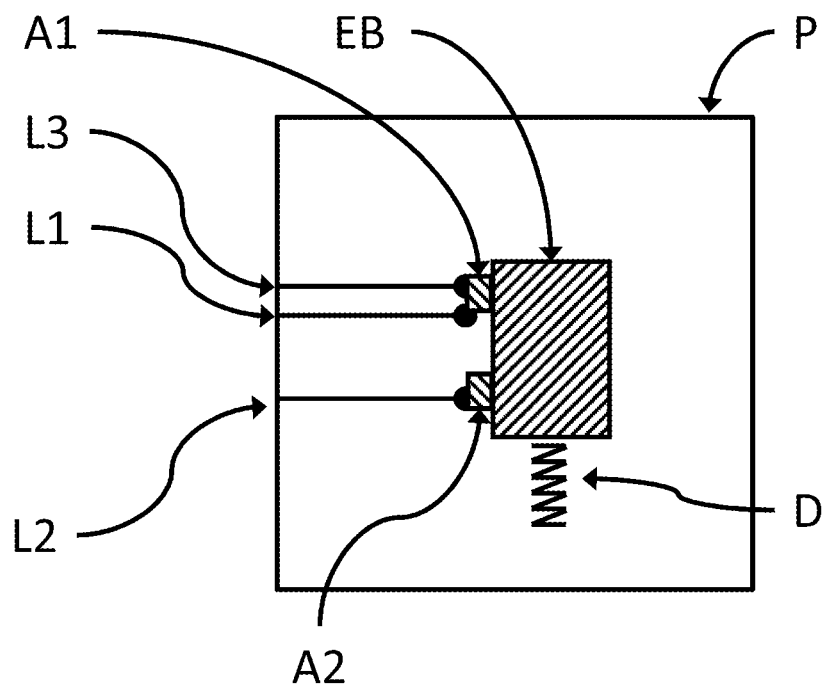
FIG. 5 shows a schematic layout of an assembly according to yet another embodiment of the invention in a plan view in a first state.
Figure 6:
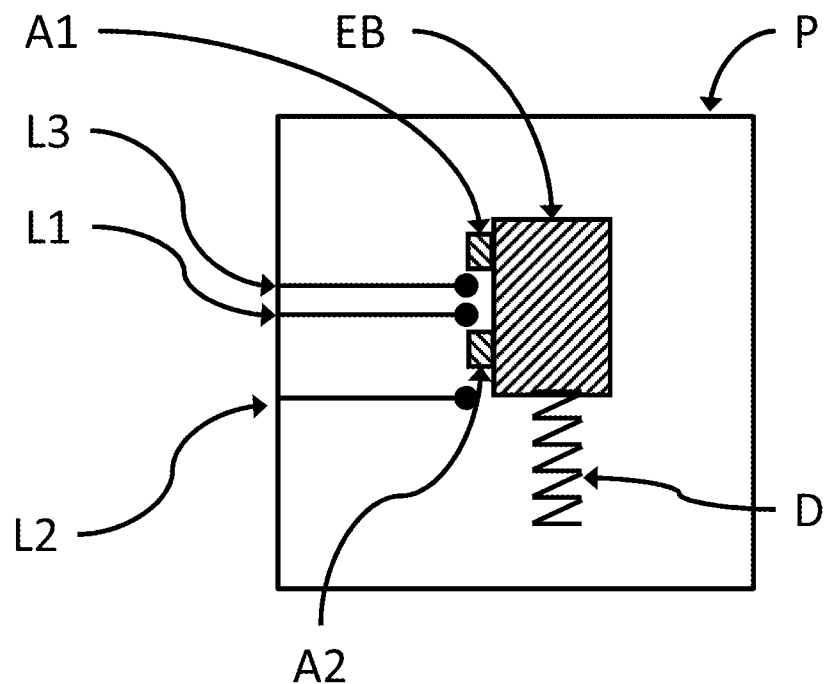
FIG. 6 shows a schematic layout of an assembly according to yet another embodiment per FIG. 5 of the invention in a plan view in a second state.
Figure 7:
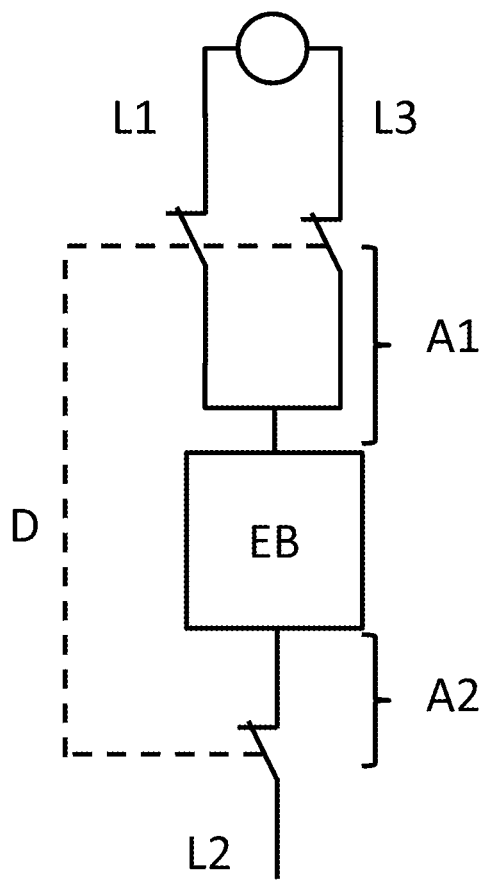
FIGS. 7 and 8 show schematic circuit diagrams of embodiments of the invention.
Figure 8:
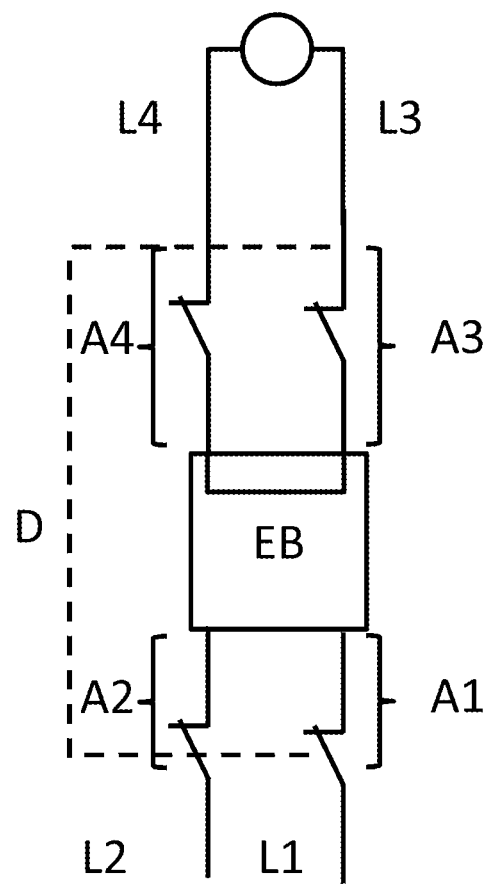

That is, unlike with the prior art, no additional switch is required, but instead an electrical potential is made available when changing from a first state (working/operating state—see e.g. FIGS. 1, 2 and 5) to a second state (fault/disconnection state—see e.g. FIGS. 3, 6). In this way, no additional mechanical components are needed. By the elimination of mechanical components, the production costs and the required design space can be reduced. Furthermore, the elimination of mechanical components results in heightened safety, since now there is less risk of faults due to individual mechanical parts.

That is, by dividing the electrical connection between L1 and L3, a potential can now be measured between these two lines, e.g., when L1 continues to be at the power supply voltage.

Figure 4:
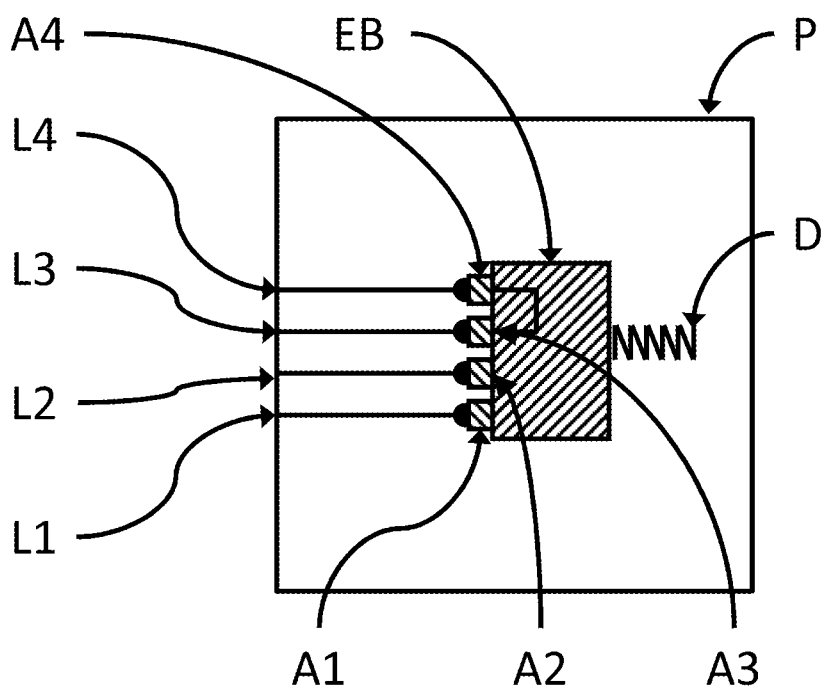
FIG. 4 shows a schematic layout of an assembly according to further embodiments of the invention in a plan view in a first state.

In another embodiment of the invention—as represented in FIG. 4—an assembly 1 according to the invention comprises a carrier P. An electrotechnical component EB is arranged on the carrier P. A first electrical power supply line L1 and a second electrical power supply line L2 going to the electrotechnical component EB are provided on or in the carrier P.

The electrotechnical component EB comprises a first connection A1, a second connection A2, a third connection A3, and a fourth connection A4, wherein the third connection A3 and the fourth connection A4 are substantially electrically short-circuited in the interior of the electrotechnical component EB.

The first connection A1 is attached on the carrier P by a thermally softenable solder material to the first electrical power supply line L1. The second connection A2 is attached on the carrier P by a thermally softenable solder material to the second electrical power supply line L2.

A first electrical signal line L3 and a second electrical signal line L4 to the electrotechnical component EB are provided on or in the carrier P, wherein the third connection A3 is attached on the carrier P by a thermally softenable solder material to the first electrical signal line L3, and wherein the fourth connection A4 is attached on the carrier P by a thermally softenable solder material to the second electrical signal line L4.

The assembly furthermore comprises a mechanical prestressing D, which in the event that the solder material is softened can displace the electrotechnical component EB on the surface substantially in a parallel plane to the carrier P or orthogonally to the carrier P so that the electrical attachment of the first electrical power supply line L1, the second electrical power supply line L2, the first electrical signal line L3, and the second electrical signal line L4 is interrupted such that a potential can now be measured between the first electrical signal line L3 and the second electrical signal line L4.

That is, unlike with the prior art, no additional switch is required, but instead an electrical potential is made available when changing from a first state (working/operating state—see e.g. FIG. 4) to a second state (fault/disconnection state). In this way, no additional mechanical components are needed. By the elimination of mechanical components, the production costs and the required design space can be reduced. Furthermore, the elimination of mechanical components results in heightened safety, since now there is less risk of faults due to individual mechanical parts.

That is, by the displacement of the electrotechnical component EB, the short circuit present in the interior of the electrotechnical component EB (represented in FIG. 4 by a connection line in the electrotechnical component) is broken. Such electrical connections are often found in integrated circuits in the form of so-called NC-connections.

In the embodiment of FIG. 4, furthermore, a galvanic separation can be advantageously provided between signal circuit (signal lines L3 and L4) and working circuit (power supply lines L1, L2). That is, a signal circuit can be operated independently of the working circuit, so that for example other voltage levels can be used, more favorable to a subsequent processing.

In all embodiments of the invention, it may furthermore be provided that a solder pad is used for the electrical connection of the first electrical power supply line L1 and for the first electrical signal line L3, which are joined together in the soldered state by the solder material and the first connection A1 of the electrotechnical component EB. These solder pads may be arranged, e.g., such that the first connection A1 at least partly covers both the solder pad of the first electrical power supply line L1 and the solder pad of the first electrical signal line L3. A soldering will then produce an electrical connection. That is, the invention can be implemented with simple design measures.

In all embodiments of the invention, it may furthermore be provided that the electrotechnical component EB is chosen from a group comprising varistor, transient voltage suppressor diode, PTC, NTC, gas discharge tube, transistor, thyristor, and integrated circuit.

That is, the invention is not limited to voltage surge protection, but rather can be used with the most diverse components.

In all embodiments of the invention it may furthermore be provided that the force accumulator D comprises a spring. The spring may be configured as a helical spring.

Other force accumulators D can be made from an elastomer, for example.

In all embodiments of the invention it may furthermore be provided that the carrier P comprises a circuit board material. Generally the carrier material is rigid and flat. However, other embodiments are not ruled out.

In all embodiments of the invention, it may furthermore be provided that two solder pads arranged next to each other are used for the electrical connection of the first electrical power supply line L1 and the first electrical signal line L3, wherein the solder pads in the soldered state are joined to each by the solder material and the first connection A1 of the electrotechnical component EB, wherein the solder pads arranged next to each other are arranged substantially behind one another in the shear direction. Such an arrangement is shown, e.g., in FIG. 5 (working/operating state) and FIG. 6 (fault/disconnection state).

In the embodiments of the invention according to FIGS. 1-4, two solder pads arranged next to each other are used for the electrical connection of the first electrical power supply line L1 and the first electrical signal line L3, wherein the solder pads in the soldered state are joined to each other by the solder material and the first connection A1 of the electrotechnical component EB, wherein the solder pads arranged next to each other are arranged substantially parallel in the shear direction.

That is, thanks to the possibility of providing different shear directions parallel to the carrier P, the spatial circumstances can be taken into account.

Likewise, however, it is also possible to loosen the electrotechnical component EB orthogonally to the carrier P. For this, e.g., a force accumulator is provided (substantially) orthogonally to the carrier P, which when heated exerts tension or pressure on the electrotechnical component EB orthogonally to the carrier P.

That is, in the invention an electrotechnical component EB (such as a gas discharge tube, varistor, or suppressor diode) is soldered on a carrier P. The electrical power supply lines L1, L2 are likewise carrier-based.

In the new solution described here, a solder pad which is coordinated with an electrical connection contact of a component EB is "divided" between two separate pads. The electrical connection of the component EB in this case can at least partially cover both (partial) solder pads. At the same time, an electrical connection is provided by this and/or by the soldering. Now, if the component EP is displaced along the surface of the carrier P (after being acted upon by heat), the component EB will be disconnected from the electrical circuit(s). Likewise, the two (partial) solder pads will be electrically separated from each other. This additional "switch contact," realized with no additional expense, makes it possible to realize a simple and economically effective remote reporting of the status of the disconnection device.

Alternatively, the component EB can be assigned to only one of the two (partial) solder pads and the connection to the second of the two (partial) solder pads is produced by a solder bridge. If, now, the component is heated unacceptably and consequently separated from the solder pads, the solder bridge which joins the two pads together will likewise be heated and interrupted upon displacement of the component EB.

LIST OF REFERENCES

1 Assembly
EB Electrotechnical component
P Carrier
L1, L2 Electrical connecting line
A1, A2 Connection
L3 Signal line
D Mechanical prestress, force accumulator
A3, A4 Connection

The invention claimed is:

1. An assembly comprising:
an electrotechnical component on a carrier, wherein the electrotechnical component is arranged on the carrier, wherein a first electrical connecting line and a second electrical connecting line going to the electrotechnical component are provided on or in the carrier, wherein the electrotechnical component comprises a first connection, a second connection, a third connection, and a fourth connection, wherein the third connection and the fourth connection are substantially electrically short-circuited in the interior of the electrotechnical component, wherein the first connection is attached on the carrier by a thermally softenable solder material to the first electrical power supply line, and wherein the second connection is attached on the carrier by a thermally softenable solder material to the second electrical power supply line, wherein a first electrical signal line and a second electrical signal line to the electrotechnical component are provided on or in the carrier, wherein the third connection is attached on the carrier by a thermally softenable solder material to the first electrical signal line, and wherein the fourth connection is attached on the carrier by a thermally softenable solder material to the second electrical signal line, wherein the assembly furthermore comprises a mechanical prestressing, which in the event that the solder material is softened can displace the electrotechnical component on the surface substantially in a parallel plane to the carrier or orthogonally to the carrier so that the electrical attachment of the first electrical power supply line, the second electrical power supply line, the first electrical signal line, and the second electrical signal line is interrupted such that a potential can now be measured between the first electrical signal line and the second electrical signal line.

2. The assembly according to claim 1, wherein a solder pad is used for the electrical connection of the first electrical power supply line to the first connection and for the electrical connection of the first electrical signal line to the third connection.

3. The assembly according to claim 1, wherein the electrotechnical component is chosen from a group comprising a varistor, a transient voltage suppressor diode, a positive temperature coefficient (PTC) device, a negative temperature coefficient (NTC) device, a gas discharge tube, a transistor, a thyristor, or an integrated circuit.

4. The assembly according to claim 1, wherein the mechanical prestressing comprises a spring.

5. The assembly according to claim 1, wherein the carrier comprises a circuit board material.

6. The assembly according to claim 1, wherein two solder pads are used for the electrical connection of the first electrical power supply line to the first connection and the first electrical signal line to the third connection, wherein the two solder pads are arranged in a shear direction.

7. The assembly according to claim 1, wherein two solder pads arranged next to each other are used for the electrical connection of the first electrical power supply line to the first connection and the second electrical power supply line to the second connection, wherein the two solder pads arranged next to each other are arranged substantially parallel in a shear direction.

* * * * *